(12) United States Patent
Kim (10) Patent No.: US 6,424,800 B1
(45) Date of Patent: Jul. 23, 2002

(54) BUBBLER

(75) Inventor: Dae-sig Kim, Seongnam (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/665,114

(22) Filed: Sep. 20, 2000

(30) Foreign Application Priority Data

Sep. 21, 1999 (KR) .............................. 99-40648

(51) Int. Cl.⁷ ........................... C23C 14/00; C23C 16/00
(52) U.S. Cl. ..................................... 392/388; 118/724
(58) Field of Search .................... 392/386, 388, 392/394, 395; 118/715, 723 VE, 724, 725, 726; 427/248.1, 255.23, 592, 593

(56) References Cited

U.S. PATENT DOCUMENTS

| | | | | |
|---|---|---|---|---|
| 4,770,630 A | * | 9/1988 | Akimoto et al. ............ 432/121 |
| 5,421,895 A | * | 6/1995 | Tsubouchi et al. .......... 118/726 |
| 5,580,822 A | * | 12/1996 | Hayakawa et al. ......... 118/715 |
| 5,651,827 A | * | 7/1997 | Aoyama et al. ............ 118/725 |
| 6,058,926 A | * | 5/2000 | Ruiz ........................... 126/33 |

FOREIGN PATENT DOCUMENTS

JP         11092941         4/1999

* cited by examiner

*Primary Examiner*—Sang Paik
(74) *Attorney, Agent, or Firm*—Lee & Sterba, P.C.

(57) ABSTRACT

A bubbler for use in vaporizing a precursor (source) for thin film deposition includes a vaporizer chamber, the vaporizer chamber having defined therein a source inlet hole, an exhaust hole and a carrier gas inlet hole; a source supply unit connected to the source inlet hole; a plate installed in the vaporizer chamber, the plate being adapted to receive a source entering into the vaporizer chamber; and a heater source installed in the vaporizer chamber, the heater source being adapted to evenly heat the plate.

6 Claims, 9 Drawing Sheets

BUBBLER

BACKGROUND OF THE INVENTION

1. Field of the Invention

The present invention relates to a bubbler for vaporizing a precursor for thin film deposition.

2. Description of the Related Art

In metal-organic chemical vapor deposition (MOCVD) processes, a precursor (source) for thin film deposition is vaporized in a bubbler and then carried along with carrier gas into a reaction chamber. Here, the amount of precursor supplied into the reaction chamber is influenced by parameters including the bubbler's temperature and pressure and the flow rate of the carrier gas. Thus, such parameters that determine the amount of precursor exhausted from the bubbler must be accurately controlled to deposit a thin film to a desired thickness.

Figure 1:
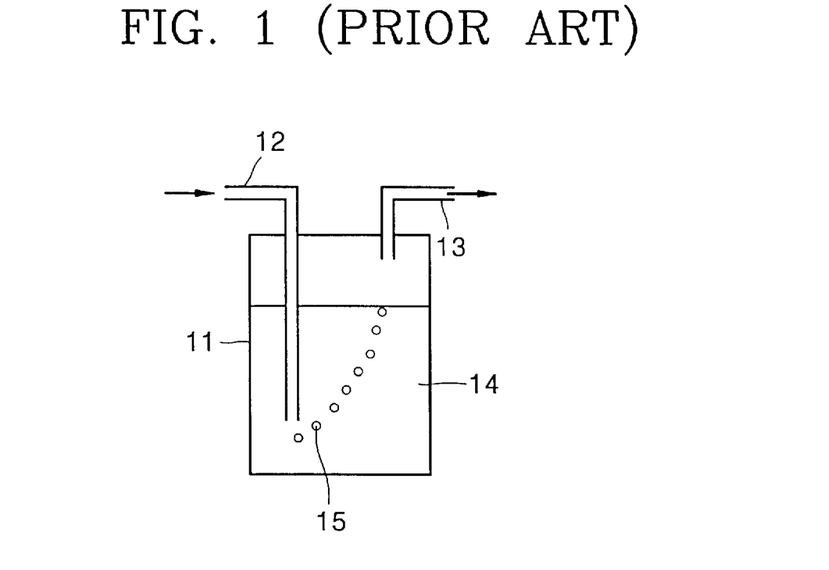
FIG. 1 is a sectional view of an example of a conventional bubbler for liquid sources.

FIG. 1 is a sectional view of a conventional bubbler for use in vaporizing a liquid source. The bubbler shown in FIG. 1 has a carrier-gas inlet tube 12, which is immersed in the liquid source 14 in a container 11, and an exhaust tube 13 set above the surface of the liquid source 14. A carrier gas 15 supplied through the carrier-gas inlet tube 12 forms bubbles, and the liquid source 14 is carried by a stream of carrier-gas bubbles through the exhaust tube 13. The carrier gas 15 in the form of bubbles increases the contact area with the liquid source 14, and thus this vaporization technique has the advantage of high source supply efficiency. However, the vaporization efficiency of the above bubbler is low when a less vaporizable source is used. Thus, the sources which can be used in the bubbler are limited.

Figure 2:
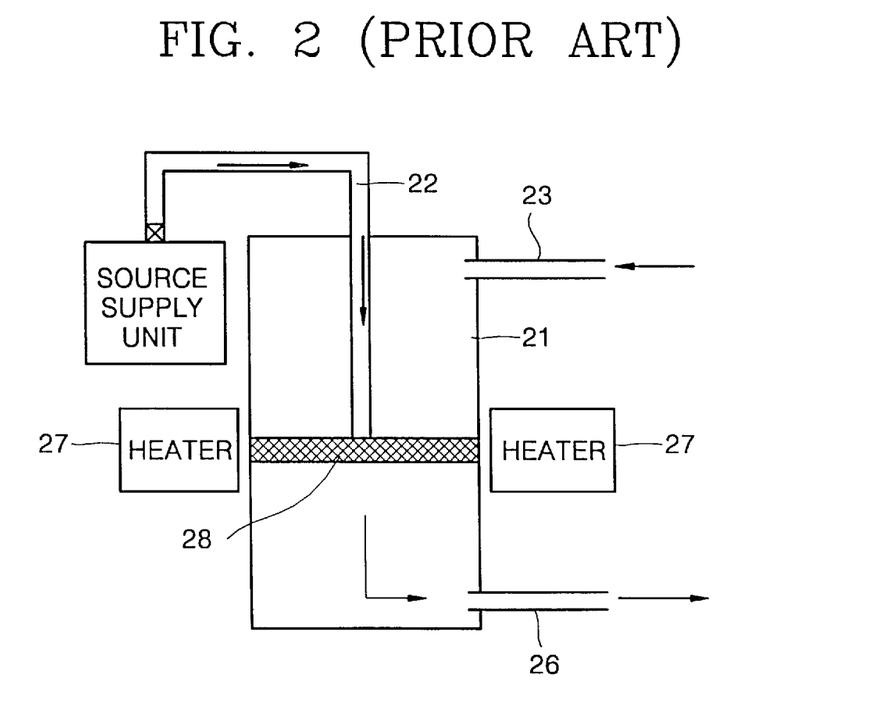
FIG. 2 is a sectional view of another example of the conventional bubbler for liquid sources.

To account for this problem, another bubbler as shown in FIG. 2 was suggested. The conventional bubbler of FIG. 2 includes a porous plate 28, which is positioned at the middle of a vaporizer chamber 21 to enhance the vaporization efficiency of a less vaporizable source, and a heater 27, which is installed close to the outer wall of the vaporizer chamber 21 to heat the vaporizer chamber 21. In the bubbler, a liquid source supplied through a source inlet tube 22 is vaporized while passing through the porous plate 28 heated by the heater 27, and exhausted through an exhaust tube 26, along with a carrier gas supplied through a carrier-gas inlet tube 23. The vaporization efficiency thus can be improved. However, there are problems in that the temperature distribution in the vaporizer chamber 21 varies according to the proximity to the heater 27, and the vaporization efficiency of the source is nonuniform over the porous plate 28.

Figure 3:
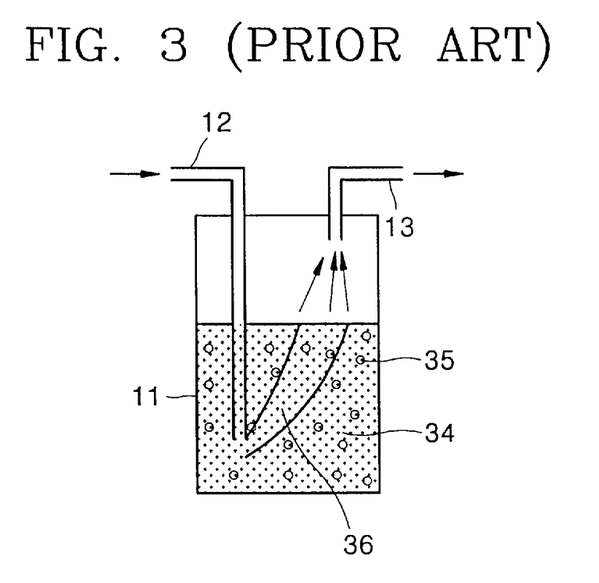
FIG. 3 is a sectional view of an example of a conventional bubbler for solid sources.

Another drawback of the bubbler shown in FIG.1 is found when a solid source is applied to the bubbler. Referring to FIG. 3, as a carrier gas 35 is supplied through the carrier-gas inlet tube 12 into a solid source 34 in the container 11, the carrier gas 35 forms a gas tunnel 36 while carrying the solid source 34. Here, the width and depth of the gas tunnel 36 are enlarged over time with use of the bubbler. Also, as the size of the gas tunnel 36 increases, the amount of solid source 34 carried by the carrier gas 35 varies, so that the amount of source supplied into a reaction chamber (not shown) cannot be accurately controlled. In addition, if the gas tunnel 36 is enlarged too much to carry the solid source 34, the bubbler must be replaced by new one although a considerable amount of solid source 34 yet remains in the container 11. Thus, there is a problem of waste of source.

Figure 4:
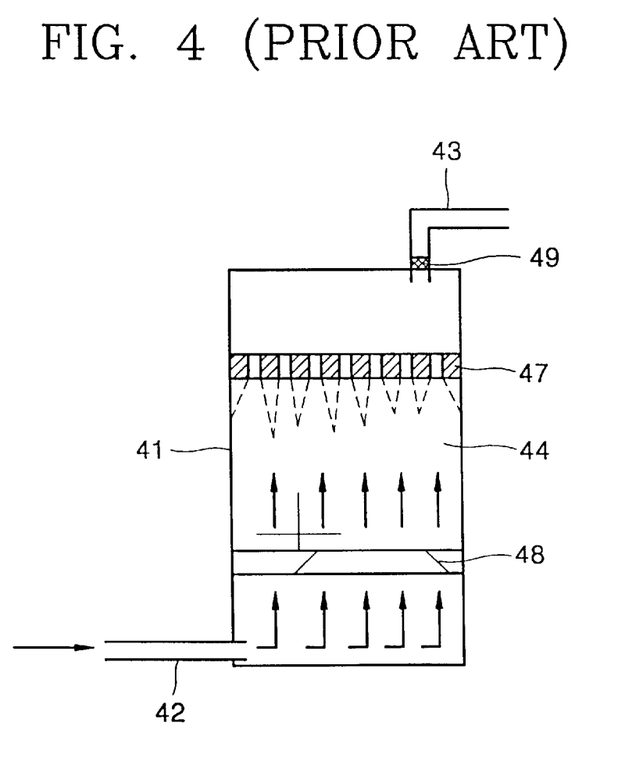
FIG. 4 is a sectional view of another example of the conventional bubbler for solid sources.

Another example of a bubbler for solid sources is shown in FIG. 4. The conventional bubbler of FIG. 4 has a compressing plate 47 seated on a solid source 44 contained in a vaporizer chamber 41, and a porous plate 48 on which the solid source 44 is put. An exhaust tube 43 is connected to the top of the vaporizer chamber 41, separated a predetermined distance from the compressing plate 47, and a porous filter 49 is fitted to the exhaust tube 43 so as to prevent leakage of the unvaporized solid source. A carrier-gas inlet tube 42 is connected to the vaporizer chamber 41 near the bottom thereof. In the bubbler, a carrier gas supplied through the carrier-gas inlet tube 42 enters the solid source 44 through the porous plate 48, which allows uniform and wide contact between the solid source 44 and the carrier gas. However, the bubbler also fails to effectively vaporize less vaporizable sources, such as $Sr(thd)_2$ and $Ba(thd)_2$. Thus, the applicable sources are limited.

SUMMARY OF THE INVENTION

It is a feature of the present invention to provide a bubbler capable of controlling the amount of source being vaporized therein with improved vaporization efficiency, and thus to loosen the limitation of applicable sources.

In accordance with one aspect of the present invention, there is provided a bubbler including a vaporizer chamber, the vaporizer chamber having defined therein a source inlet hole, an exhaust hole and a carrier gas inlet hole; a source supply unit connected to the source inlet hole; a plate installed in the vaporizer chamber, the plate being adapted to receive a source entering into the vaporizer chamber; and a heater source installed in the vaporizer chamber, the heater source being adapted to evenly heat the plate.

Preferably, the heater source has an area that is larger than the area of the facing porous plate, and the plate is a porous plate having pores capable of capturing the source. Preferably, the bubbler further comprises source diffusing means disposed in the vaporizer chamber, for causing the source to uniformly diffuse into the plate.

Other features and advantages of the present invention will become apparent to those skilled in the art from the following detailed description. It is to be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

The above features and advantages of the present invention will become more apparent by describing in detail preferred embodiments thereof with reference to the attached drawings in which.

In the drawings, like elements are numbered alike throughout.

DETAILED DESCRIPTION OF THE INVENTION

Priority Korean Patent Application No. 99-40648, filed Sep. 21, 1999, is incorporated herein in its entirety by reference.

According to the invention, a bubbler is provided including a vaporizer chamber; a source supply unit connected to a source inlet hole formed into the vaporizer chamber, for supplying a source to be vaporized into the vaporizer chamber; a plate installed in the vaporizer chamber, for receiving the source entering into the vaporizer chamber; an exhaust hole formed, for example, at a side of the vaporizer chamber, for exhausting source vapor; a carrier gas inlet hole formed, for example, at a side of the vaporizer chamber, for supplying a carrier gas into the vaporizer chamber; and a heater source, installed, for example, facing the plate in the vaporizer chamber, for evenly heating the plate.

Figure 5:
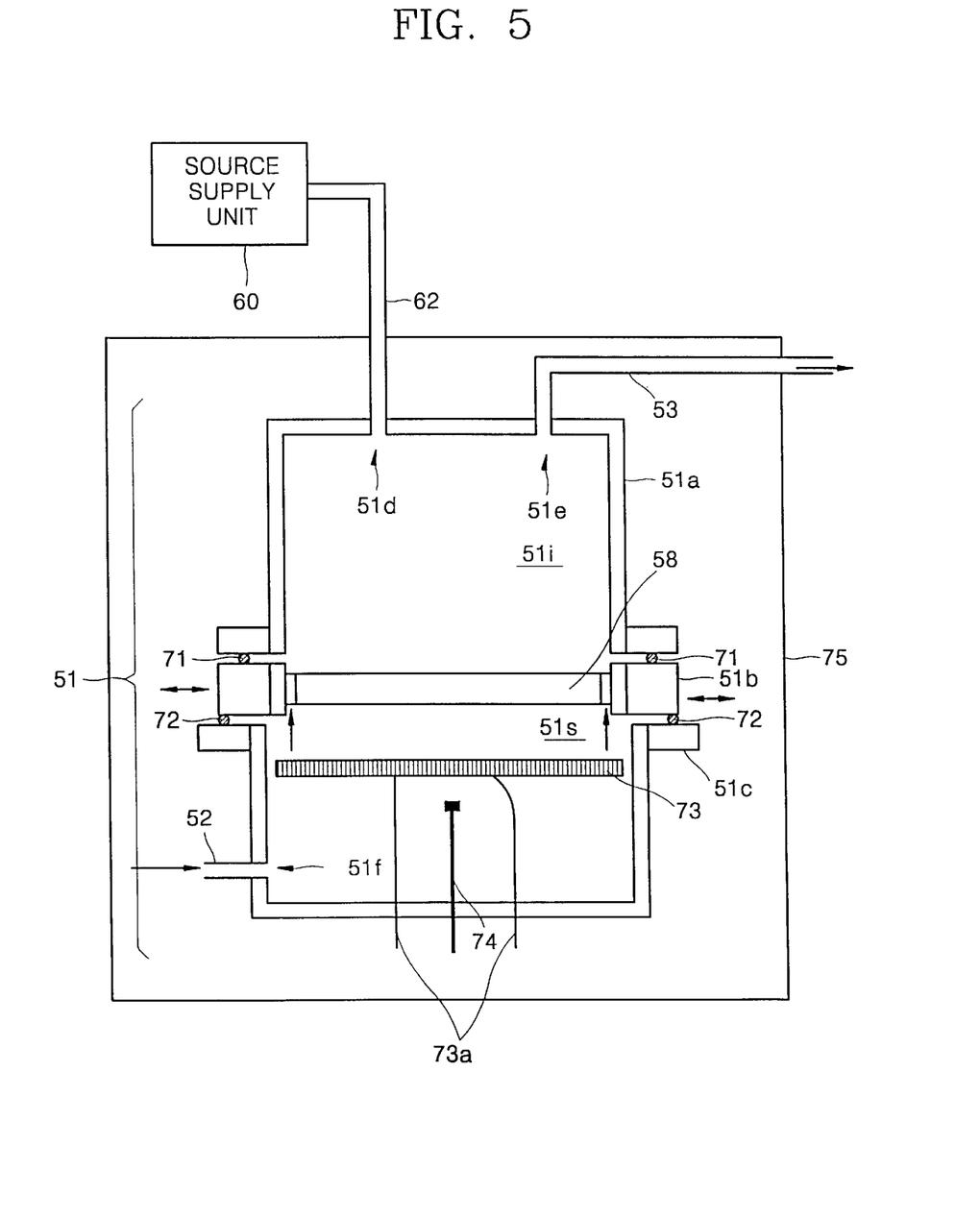
FIG. 5 is a sectional view of a first embodiment of a bubbler according to the present invention.

Referring to FIG. 5, a first embodiment of a bubbler according to the present invention includes a vaporizer chamber 51, a source supply unit 60, a plate 58, a heater source 73, a thermosensor 74 and an oven 75. It is shown that the vaporizer chamber 51 is installed within the oven 75 for heating.

Figure 7:
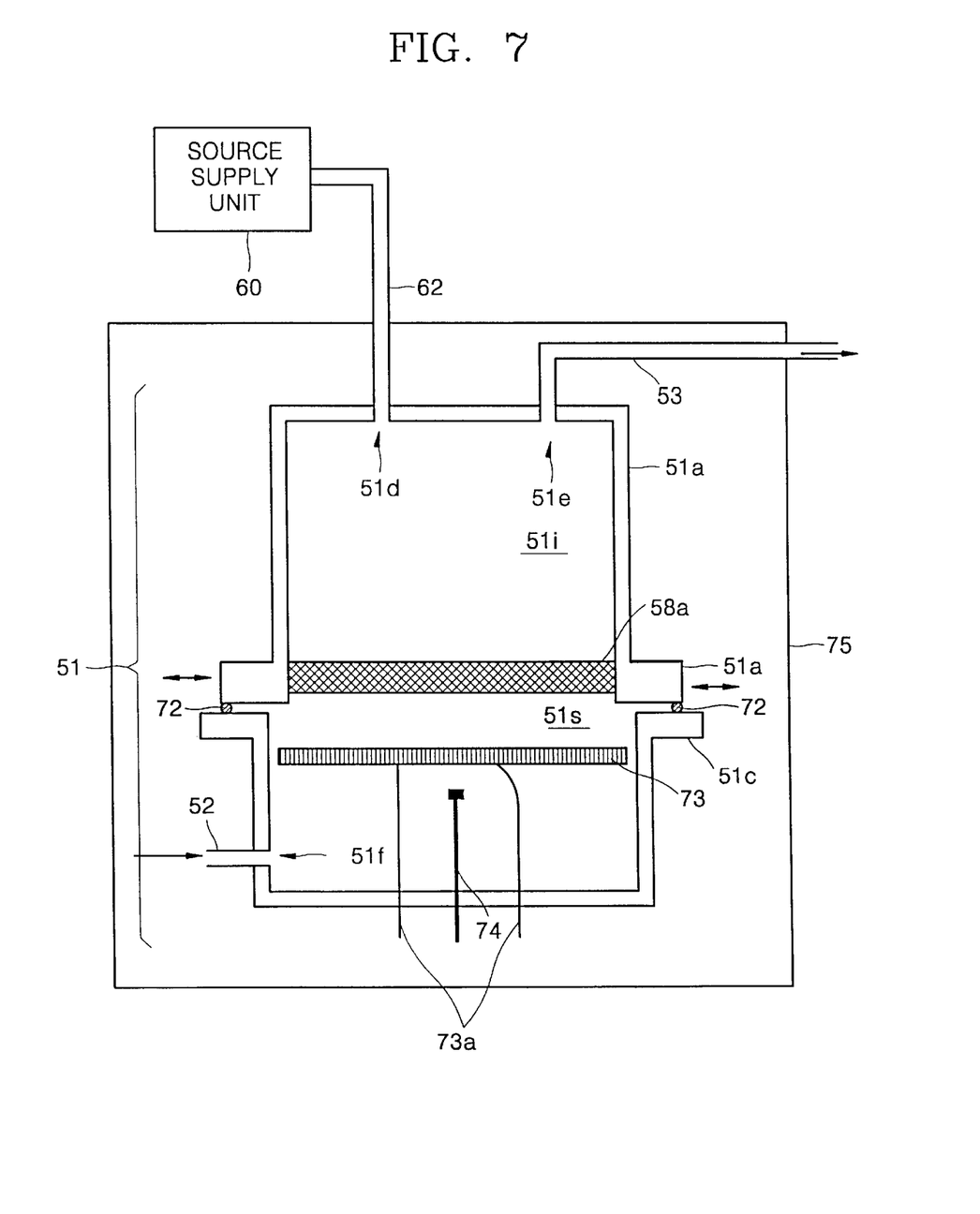
FIG. 7 is a sectional view of a third embodiment of a bubbler according to the present invention.

The vaporizer chamber 51 includes a bracket 51b for holding the plate 58, an upper body 51a which forms a source compartment 51i with the top end of the bracket 51b and the plate 58, and a lower body 51c which forms a carrier-gas compartment 51s with the bottom end of the bracket 51b and the plate 58. Preferably, the bracket 51b is installed to be movable into and out of the vaporizer chamber 51b between the upper and lower bodies 51a and 51c, which allows for changing of the plate 58. Gaskets 71 and 72 are provided between the bracket 51b, and the upper and lower bodies 51a and 51c respectively for air tightening the vaporizer chamber 51. Alternatively, the bubbler can be constructed such that the upper body 51a and the bracket 51b are combined while the lower body 51c can be separated from the combination, as shown in FIG. 7.

Turning back to FIG. 5, a source inlet hole 51d and an exhaust hole 51e are formed in the top of the upper body 51a. Reference numeral 62 represents a source inlet tube, which connects the source supply unit 60 and the source inlet hole 51d, and reference numeral 53 represents an exhaust tube, which connects the exhaust hole 5le to a reaction chamber (not shown) positioned out of the oven 75.

In the lower body 51c, a carrier-gas inlet hole 51f, through which a carrier-gas which facilitates exhaust of the source vapor is introduced, the heater source 73, for heating the plate 58, and the thermosensor 74, for measuring the temperature of the vaporizer chamber 51, are installed. Reference numeral 52 represents a carrier-gas inlet tube, and reference numeral 73a represents electrical wires.

The plate 58 on which the source introduced in the vaporizer chamber 51i s placed, heats the source via heat generated by the heater source 73. The plate 58 can be made of a variety of materials. Preferably, the plate 58 is formed of a gas permeable porous material. If the plate 58 is made of a non-porous material that hardly passes gases, a carrier-gas path, which allows entry of a carrier-gas into the source compartment 51i, may be formed at the plate 58, as indicated by arrows in FIG. 5. In contrast, as shown in FIG. 6, the carrier-gas inlet hole 51f may be formed in the upper body 51a.

The heater source 73 is installed parallel to and facing the plate 58. Preferably, the heater source 73 is manufactured to be larger than the plate 58 for uniform heating of the plate 58. The heater source 73 heats the plate 58 by electric power supplied through the electrical wires 73a. The heater source 73 can be positioned a predetermined distance apart from the plate 58, or in contact with the plate 58 as shown in FIG. 6. The distance between the plate 58 and the heater source 73 is determined in consideration of the optimum vaporization efficiency of the various sources. Exemplary heater sources 73 include, without limitation, a hot wire formed of a nickel-chromium (Ni-Cr) alloy, silicon carbonate (SiC) or platinum (Pt), and a halogen lamp.

Figure 6:
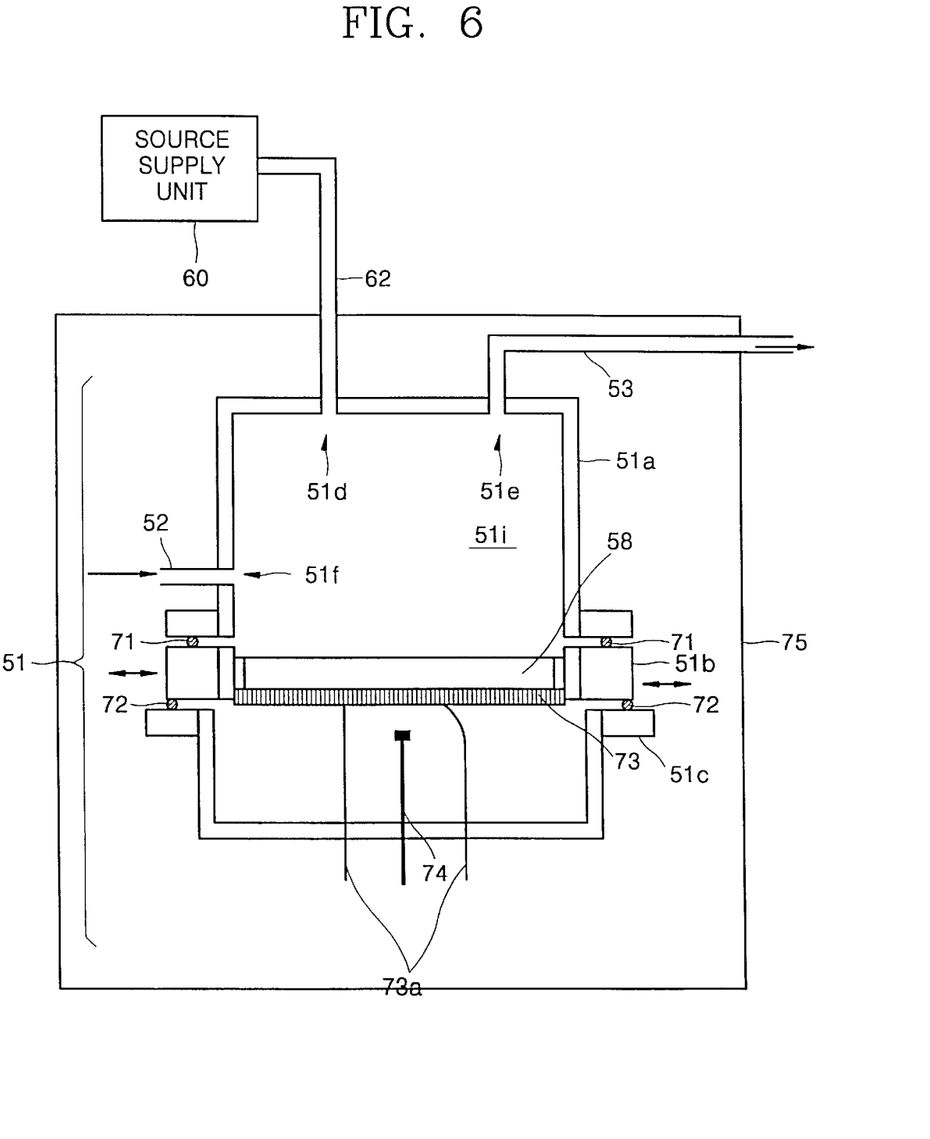
FIG. 6 is a sectional view of a second embodiment of a bubbler according to the present invention.

The bubblers shown in FIGS. 5 and 6, can uniformly heat the plate 58 by using the heater source 73, so that the variation of temperature over the plate 58 is decreased. As a result, the variation in vaporization rate of the source according to position on the plate 58 is also lowered. In addition, in the present embodiments, since the heater source 73 is installed in the vaporizer chamber 51, the size of the heater source 73 can be increased along with the plate 58 for a larger bubbler, so that the amount of source vaporization can be increased.

Another embodiment of the bubbler according to the present invention, which can raise further the vaporization rate of the source, is shown in FIG. 7. Elements having the same functions as those in the previous embodiments are designated with like reference numerals. Referring to FIG. 7, a porous plate 58a with a number of pores is employed. The fine pores of the porous plate 58a adsorb the source and make the transfer of the carrier gas easier. The porous plate 58a can be formed of a variety of materials. As an example, the porous plate 58a can be manufactured by applying heat to stainless metal powder. While the source is adsorbed by the fine pores of the porous plate 58a, the source molecules can be further separated, increasing the surface area. As a result, the vaporization rate improves. As mentioned previously, since the porous plate 58a is able to pass a carrier gas, the exhaust rate of the source vapor also increases.

Figure 8:
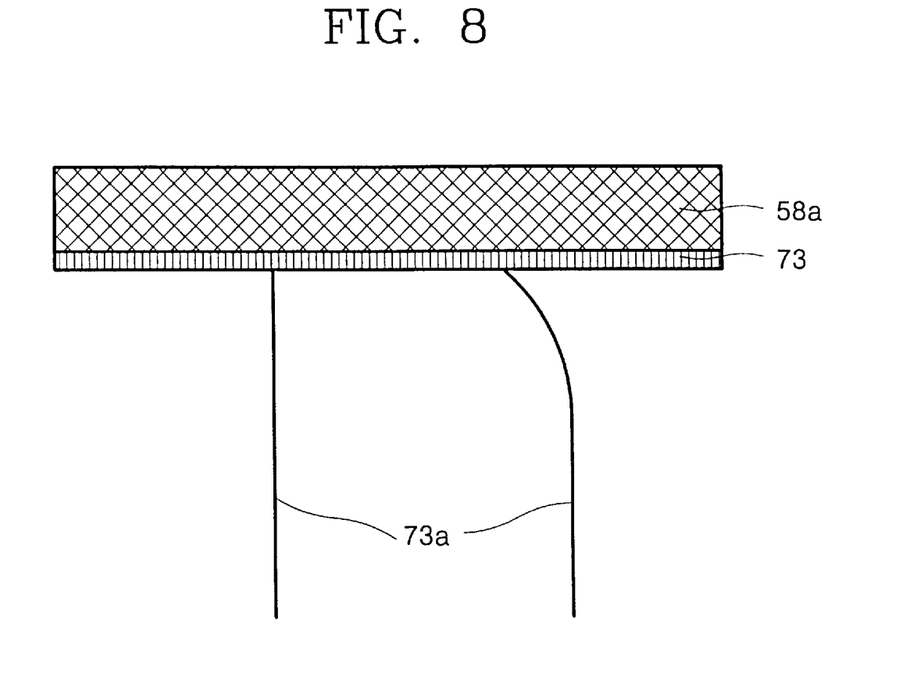
FIG. 8 shows a combination of a heating source and a porous plate surface.
Figure 9:
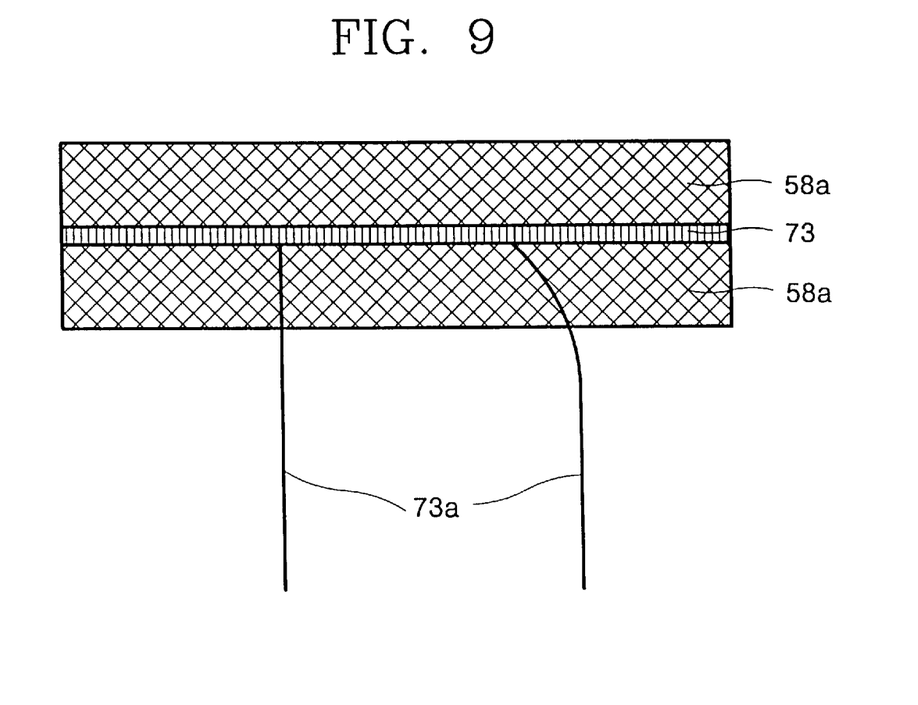
FIG. 9 shows another combination of a heating source within a porous plate.

As shown in FIG. 7, the heater source 73 can be spaced a predetermined distance apart from the porous plate 58a. Alternatively, the heater source 73 can be in contact with the surface of the porous plate 58a, as shown in FIG. 8. For example, the heater source 73 can be formed of hot wires made of Pt by printing and then combining with the porous plate 58a. This combination configuration enhances heat transfer efficiency from the heater source 73 to the porous plate 58a. Alternatively, the heater source 73 can be embedded in the porous plate 58a as shown in FIG. 9.

Figure 10:
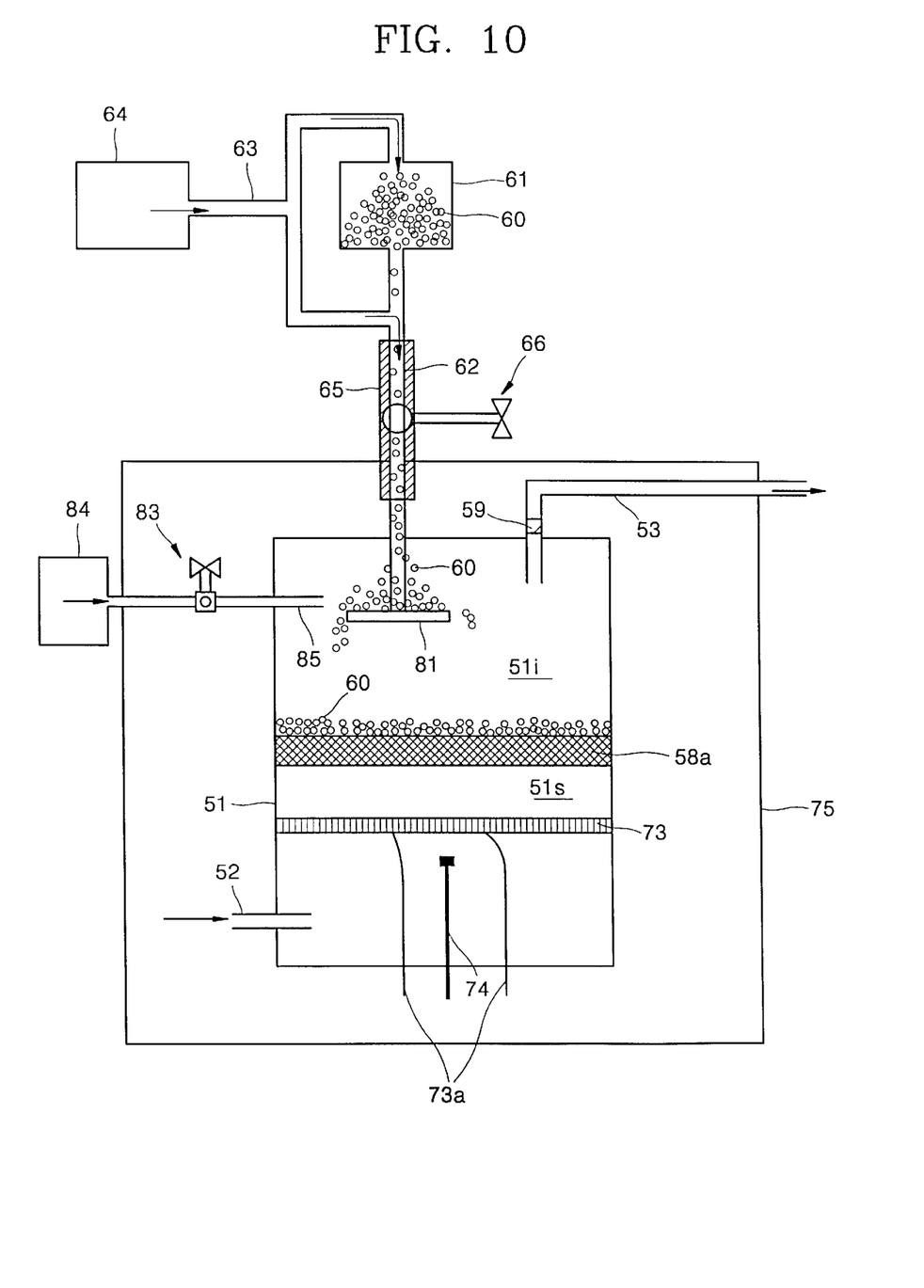
FIG. 10 is a sectional view of a fourth embodiment of a bubbler according to the present invention.
Figure 12:
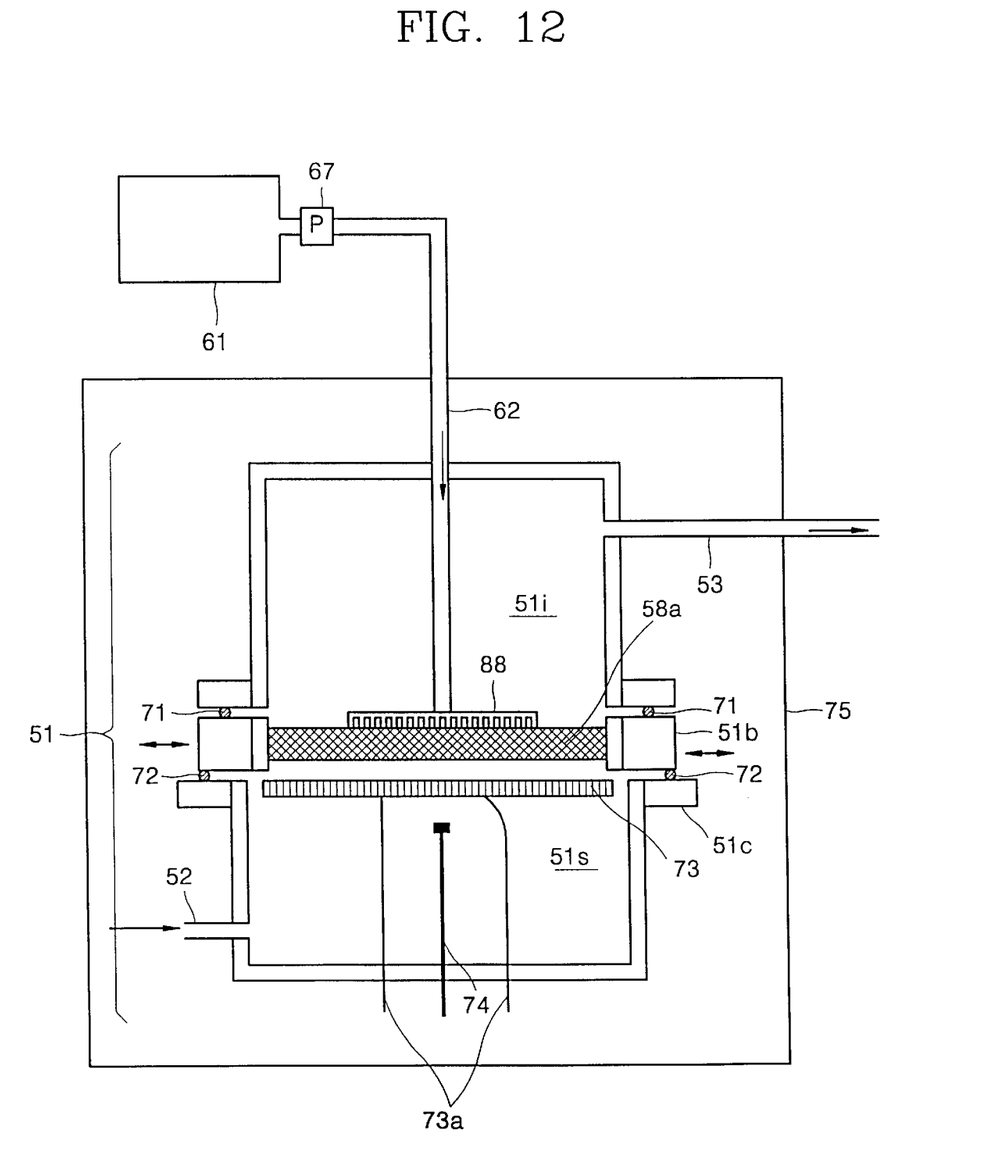
FIG. 12 is a sectional view of a fifth embodiment of a bubbler according to the present invention.

The previously mentioned bubblers are applicable to both solid and liquid sources. Preferably, the bubblers further include source diffusing means for evenly diffusing the source into the plate 58 or 58a. Exemplary embodiments of a bubbler including source diffusing means, which are suitable for solid and liquid sources, respectively, are shown in FIGS. 10 and 12. In FIGS. 10 and 12, elements having the same functions as those in the previous embodiments are designated with like reference numerals.

The bubbler of FIG. 10 has a configuration appropriate for vaporizing a solid source that needs to be stored at low temperatures. Such low-temperature storage sources as Sr(thd)$_2$ and Ba(thd)$_2$ are susceptible to deterioration near melting point within 30 minutes, and are also less vaporizable. Thus, vaporizing such sources at a lower temperature than the melting temperature cannot produce vapor pressures that are high enough for a successful MOCVD process. The bubbler of FIG. 10 includes a cooling unit 65, a source supply unit and source diffusing means, which are adapted to be suitable for low-temperature storage source vaporization.

The source supply unit includes a source container 61 separated a predetermined distance from the vaporizer chamber 51, and gas blowing means for blowing a predetermined gas into the source container 61 and a gas inlet tube 62, which is connected to the source container 61 and to the source compartment 51i, so as to actively supply the source from the source container 61 into the source compartment 51i. The gas blowing means includes a gas blower 64 for blowing an inert gas, and a gas delivery tube 63, which connects the gas blower 64 to both the source container 61 and the source inlet tube 62, for delivering the inert gas into the source container 61 and the source inlet tube 62.

In the bubbler shown in FIG. 10, since the source container 61 for storing a solid source is positioned a predetermined distance apart from the vaporizer chamber 51 in which the solid source is vaporized, the solid source stored in the source container 61 is safe from being deteriorated by heat generated during vaporization in the vaporizer chamber 51.

Also, a filter 59 for filtering off the unvaporized source, which is in powder form, is fitted to the exhaust tube 53, so as to prevent entry of unvaporized source powder into a reaction chamber (not shown) for thin film deposition. Preferably, the filter 59 is formed of a porous material having pores smaller than the particle size of the solid source.

The cooling unit 65 is adopted so as to suppress a rise in the temperature of the source 60 before entry of the solid source 60 from the source container 61 into the source compartment 51i. The cooling unit 65 can be, for example, a watercooling system or an air-cooling system. The use of the cooling unit 65 can suppress an increase in the temperature of the source during delivery through the source inlet tube 62 into the source compartment 51i. A valve 66, such as a ball valve, at the source inlet tube 62 permits controlling the amount of source.

The source diffusing means, which permits evenly distributing the source 60 supplied into the source compartment 51i over the porous plate 58a, includes a source loading plate 81, which is disposed within the source compartment 51i, facing the source inlet tube 62, and an air blower 84 for blowing air across the source loading plate 81 into the source compartment 51i. The air blower 84 is connected to the source compartment 51i by an air delivery tube 85 having an air flow control valve 83.

In the bubbler according to the present invention, shown in FIG. 10, the source container 61 is separated from the vaporizer chamber 51. This enables the storing of thermally unstable sources that need to be stored at low temperatures, such as Sr(thd)$_2$ and Ba(thd)$_2$. By storing a large amount of source in the source container 61, vaporization can be continuously performed for mass production without deterioration of the source.

In a source vaporization process, first the solid source 60 stored in the source container 61 is introduced through the source inlet tube 62 into the source compartment 51i. Here, as the gas blower 64 blows a small amount of an inert gas, which is the same as a carrier gas, into the source container 61 and the source inlet tube 62 through the gas delivery tube 63, entry of the solid source 60 into the source compartment 51i through the source inlet tube 62 is facilitated. Also, the cooling operation performed by the cooling unit 65 prevents the solid source 64 from melting in the source inlet tube 62 before reaching the vaporizer chamber 51.

It is an important concern to supply an appropriate portion of the solid source 60 so as not to exceed the vaporizing capacity of the vaporizer chamber 51 in a given time period. This is because if a portion of the solid source 60 remains unvaporized in the vaporizer chamber 51, the unvaporized solid source deteriorates with time. Thus, the amount of source supplied into the source chamber 51i must be accurately adjusted in accordance with the amount of source exhausted by vaporization. In other words, it is necessary to adjust the amount of source supply to the extent that the source supplied into the source compartment 51i is fully vaporized within a predetermined time which is short enough to keep the source fresh without deterioration. As an example, Sr(thd)$_2$ and Ba(thd)$_2$ can be maintained near their melting points for about 30 minutes without deterioration, and thus it is desirable to periodically supply these sources with a predetermined period, such that they can be completely vaporized within 30 minutes.

The solid source 60 entering the source compartment 51i is uniformly diffused over the porous plate 58 by the source loading plate 81 and the air sprayer 84. Preferably, the air sprayer 84 is operated in a sequence of high-pressure air pulses to blow the solid source 60 received by the source loading plate 81. Here, the pulsing of high-pressure air abruptly raises the inner pressure. However, the volume of the vaporizer chamber 51 is sufficiently large to absorb the effect of the high-pressure pulse on a vaporization process.

The solid source 60 is provided over the porous plate 58a. For a vaporization process, the porous plate 58a is heated to an appropriate temperature by the heater source 73 to melt the solid source 60 over the porous plate 58a. If the heating temperature of the porous plate 58a is too high, deterioration of the solid source 60 is accelerated. Thus, it is preferable to heat the porous plate 58a to a temperature of 0 to about 20° C. higher than the melting temperature of the source 60 used. The control of the heating temperature by the heater source 73 is based on the temperature information provided by the thermosensor 74.

Figure 11:
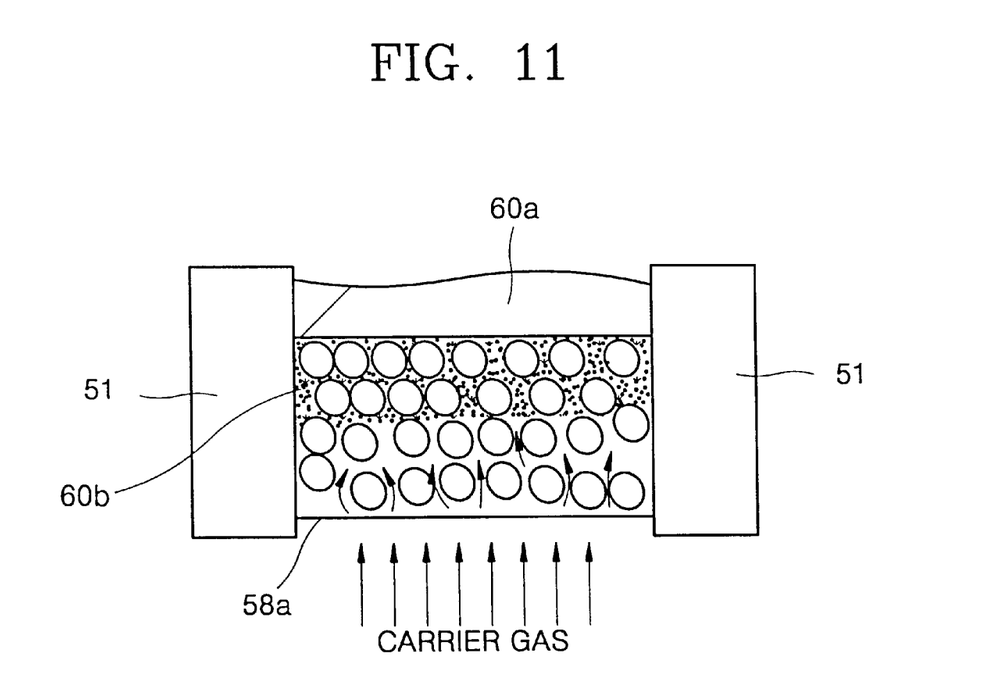
FIG. 11 is a sectional view illustrating the incorporation and vaporization of the source in the porous plate of the bubbler of FIG. 10.

As the porous plate 58a is heated by the heater source 73, the solid source 60 is changed into liquid form in the source compartment 51i. The liquid source 60a is gradually absorbed into the porous plate 58a along grain boundaries, spreading into a wide area, as shown in FIG. 11. As the liquid source 60a spreads into the porous plate 58a, the surface area of the absorbed liquid source 60a increases. On the other side of the porous plate 58a, a carrier gas supplied into the carrier gas compartment 51s through the carrier gas inlet tube 52 diffuses into the porous plate 58a and in turn facilitates vaporization of the absorbed source 60a from the porous plate 58a.

Another embodiment of the bubbler according to the present invention, which can be employed for liquid sources, will be described with reference to FIG. 12. The bubbler of FIG. 12 employs a source supply unit and source diffusing means suitable for liquid sources.

In the source supply unit, a pump 67 for adjusting the flow rate of a liquid source is installed between the source container 61 and the source supply tube 62.

As the source diffusing means, a spray nozzle 88 for spraying the liquid source through a number of fine holes from the source supply tube 62, is connected to the source supply tube 62 and is installed on the porous plate 58, as shown in FIG. 12 The hydraulic pressure of the liquid source increases while passing through the spray nozzle 88, and the liquid source is sprayed widely over the porous plate 58.

As mentioned above, the bubbler according to the present invention allows uniform heating of the plate, which receives source in a vaporizer chamber, so that the deviation of the vaporization rate of the source according to the position of the source on the plate can be reduced. In addition, the bubbler can vaporize a desired portion of source without causing deterioration of a less vaporizable source. The amount of source remaining unvaporized in the vaporizer chamber is also decreased.

While this invention has been particularly shown and described with reference to preferred embodiments thereof, it will be understood by those skilled in the art that various changes in form and details may be made thereto without departing from the spirit and scope of the invention as defined by the appended claims.

What is claimed is:

1. A bubbler comprising:
    a vaporizer chamber, the vaporizer chamber having defined therein a source inlet hole, an exhaust hole and a carrier gas inlet hole,
    a source supply unit connected to the source inlet hole;
    a porous plate installed in the vaporizer chamber, the plate being adapted to receive a source entering into the vaporizer chamber and having pores capable of capturing the source; and
    a heater source installed in the vaporizer chamber, the heater source being adapted to evenly heat the porous plate,
    wherein the heater source has an area that is larger than the area of the porous plate.

2. A bubbler comprising:
    a vaporizer chamber, the vaporizer chamber having defined therein a source inlet hole, an exhaust hole and a carrier gas inlet hole,
    a source supply unit connected to the source inlet hole;
    a porous plate installed in the vaporizer chamber, the plate being adapted to receive a source entering into the vaporizer chamber and having pores capable of capturing the source; and
    a heater source installed in the vaporizer chamber, the heater source being adapted to evenly heat the porous plate,
    wherein the vaporizer chamber comprises a bracket for receiving and holding.

3. The bubbler of claim 2, further comprising a gasket for air tightening, the gasket being installed between the bracket and body of the vaporizer chamber.

4. A bubbler comprising:
    a vaporizer chamber; the vaporizer chamber having defined therein a source inlet hole, an exhaust hole and a carrier gas inlet hole,
    a source supply unit connected to the source inlet hole;
    a porous plate installed in the vaporizer chamber, the plate being adapted to receive a source entering into the vaporizer chamber and having pores capable of capturing the source; and
    a heater source installed in the vaporizer chamber, the heater source being adapted to evenly heat the plate,
    wherein the vaporizing chamber comprises a bracket for receiving and holding the porous plate, the bracket being installed to be movable into and out of the vaporizer chamber.

5. The bubbler of claim 4, further comprising a gasket for air tightening, the gasket being installed between the bracket and the body of the vaporizer chamber.

6. The bubbler of claim 4, further comprising a thermosensor for measuring the temperature inside the vaporizer chamber, the thermosensor being installed in the vaporizer chamber.

* * * * *